(12) United States Patent
Caron et al.

(10) Patent No.: US 12,556,159 B2
(45) Date of Patent: Feb. 17, 2026

(54) BULK ACOUSTIC WAVE RESONATOR WITH INTEGRATED CAPACITOR

(71) Applicant: SKYWORKS SOLUTIONS, INC., Irvine, CA (US)

(72) Inventors: Joshua James Caron, Summerfield, NC (US); Lisha Shi, San Jose, CA (US); David Albert Feld, Los Altos, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 270 days.

(21) Appl. No.: 18/147,141

(22) Filed: Dec. 28, 2022

(65) Prior Publication Data

US 2023/0216478 A1 Jul. 6, 2023

Related U.S. Application Data

(60) Provisional application No. 63/266,178, filed on Dec. 30, 2021.

(51) Int. Cl.
*H03H 9/17* (2006.01)
*H03H 9/56* (2006.01)

(52) U.S. Cl.
CPC ............ *H03H 9/174* (2013.01); *H03H 9/568* (2013.01)

(58) Field of Classification Search
CPC .. H03H 9/02; H03H 9/17; H03H 9/54; H03H 9/56
See application file for complete search history.

(56) References Cited

U.S. PATENT DOCUMENTS

| | | | | |
|---|---|---|---|---|
| 6,924,583 B2 * | 8/2005 | Lin | .................. | H03H 9/542 |
| | | | | 310/366 |
| 7,369,013 B2 * | 5/2008 | Fazzio | ............... | H03H 9/02118 |
| | | | | 333/187 |
| 7,658,858 B2 * | 2/2010 | Hong | ................... | H03H 3/02 |
| | | | | 216/22 |
| 9,577,603 B2 * | 2/2017 | Burak | ................ | H03H 9/132 |
| 9,595,939 B2 * | 3/2017 | Link | .................. | H03H 9/02007 |
| 10,541,665 B2 * | 1/2020 | Lee | ................... | H03H 9/02133 |
| 10,601,391 B2 * | 3/2020 | Stokes | ............... | H03H 9/02086 |
| 10,886,888 B2 | 1/2021 | Ivira et al. | | |
| 11,616,489 B2 * | 3/2023 | Wang | ................. | H03H 9/13 |
| | | | | 333/187 |
| 2007/0194863 A1 * | 8/2007 | Shibata | ............. | H03H 3/02 |
| | | | | 333/187 |
| 2023/0216462 A1 | 7/2023 | Shi et al. | | |
| 2024/0243722 A1 | 7/2024 | Shin et al. | | |

* cited by examiner

*Primary Examiner* — Andrea Lindgren Baltzell
*Assistant Examiner* — Alan Wong
(74) *Attorney, Agent, or Firm* — Lando & Anastasi, LLP

(57) ABSTRACT

An integrated bulk acoustic wave resonator-capacitor comprises a membrane including a piezoelectric film, an upper electrode disposed on a top surface of the piezoelectric film, and a lower electrode disposed on a lower surface of the piezoelectric film, a resonator region of the membrane defining a main active domain in which a main acoustic wave is generated during operation, and a capacitor region of the membrane surrounding the resonator region, the capacitor region including a layer of conductive material disposed on the upper electrode, an inner capacitor raised frame defined on an inner peripheral region of the layer of conductive material, and an outer capacitor raised frame defined on an outer peripheral region of the layer of conductive material.

18 Claims, 19 Drawing Sheets

BULK ACOUSTIC WAVE RESONATOR WITH INTEGRATED CAPACITOR

CROSS-REFERENCE TO RELATED APPLICATIONS

This application claims priority under 35 U.S.C. § 119(e) to U.S. Provisional Patent Application Ser. No. 63/266,178, titled "BULK ACOUSTIC WAVE RESONATOR WITH INTEGRATED CAPACITOR," filed Dec. 30, 2021, the entire contents of which is incorporated herein by reference for all purposes.

BACKGROUND

Technical Field

Embodiments of this disclosure relate to acoustic wave devices, specifically bulk acoustic wave resonators and electronic devices and modules including same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided an integrated bulk acoustic wave resonator-capacitor. The integrated bulk acoustic wave resonator-capacitor comprises a membrane including a piezoelectric film, an upper electrode disposed on a top surface of the piezoelectric film, and a lower electrode disposed on a lower surface of the piezoelectric film, a resonator region of the membrane defining a main active domain in which a main acoustic wave is generated during operation, and a capacitor region of the membrane surrounding the resonator region, the capacitor region including a layer of conductive material disposed on the upper electrode, an inner capacitor raised frame defined on an inner peripheral region of the layer of conductive material, and an outer capacitor raised frame defined on an outer peripheral region of the layer of conductive material.

In some embodiments, the integrated bulk acoustic wave resonator-capacitor further comprises a resonator raised frame disposed on the upper electrode about a perimeter of the resonator region.

In some embodiments, the resonator raised frame abuts the inner capacitor raised frame.

In some embodiments, the resonator raised frame is formed of a different material than the inner capacitor raised frame.

In some embodiments, one of the resonator raised frame or the capacitor raised frame is formed of a dielectric material and the other of the resonator raised frame or the capacitor raised frame is formed of a metal.

In some embodiments, the resonator raised frame is formed of a same material as the inner capacitor raised frame.

In some embodiments, the layer of conductive material is formed of the same material.

In some embodiments, the upper electrode is formed of the same material.

In some embodiments, the outer capacitor raised frame is formed of the same material.

In some embodiments, the same material is a dielectric material.

In some embodiments, the outer capacitor raised frame is formed of the same material.

In some embodiments, the integrated bulk acoustic wave resonator-capacitor further comprises a support substrate upon which a periphery of the membrane is disposed and that defines a cavity beneath the resonator region.

In some embodiments, the support substrate further defines a cavity beneath the capacitor region.

In some embodiments, no cavity is defined in the support substrate below the capacitor region.

In some embodiments, the integrated bulk acoustic wave resonator-capacitor further comprises a support extending upward from a surface of the support substrate defining a lower wall of the cavity to a lower surface of the membrane.

In some embodiments, the support contacts the lower surface of the membrane at a border between the capacitor region and the resonator region.

In some embodiments, the support is in the form of one or more posts.

In some embodiments, the support is in the form of one or more walls.

In some embodiments, the layer of conductive material is formed of a same material as the upper electrode.

In some embodiments, the integrated bulk acoustic wave resonator-capacitor has a mesa structure.

In some embodiments, the integrated bulk acoustic wave resonator-capacitor is included in a radio frequency filter.

In some embodiments, the integrated bulk acoustic wave resonator-capacitor is included in an electronic device module.

In some embodiments, The integrated bulk acoustic wave resonator-capacitor is included in an electronic device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
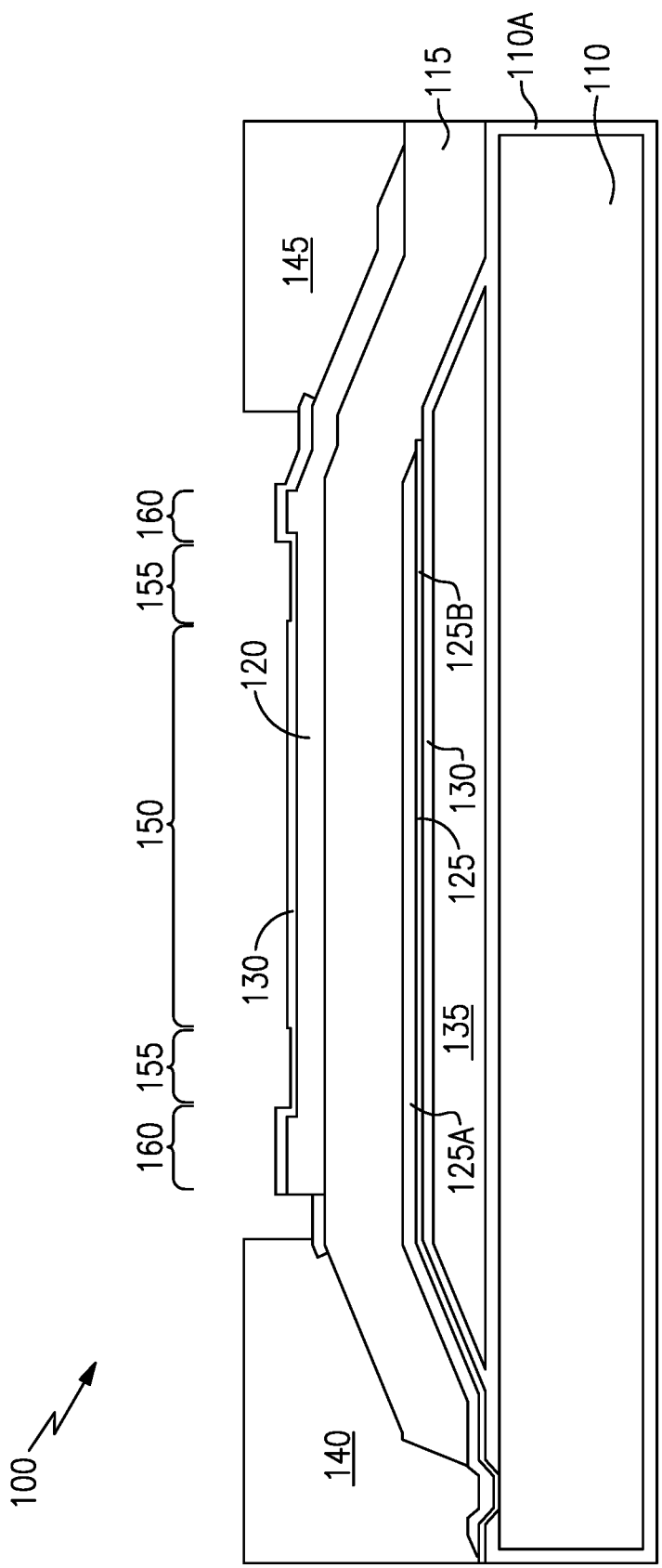
FIG. 1 is a cross-sectional view of an example of bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale and that some intermediate materials or layers are not illustrated. Moreover, it will be understood that certain embodiments can include more elements than illustrated in a drawing and/or a subset of the elements illustrated in a drawing. Further, some embodiments can incorporate any suitable combination of features from two or more drawings.

Bulk acoustic wave (BAW) resonators may include a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A BAW exhibits a frequency response to applied signals with a resonance peak determined by a thickness of the film of piezoelectric material. Ideally, the only acoustic wave that would be generated in a BAW is a main acoustic wave that would travel through the film of piezoelectric material in a direction perpendicular to layers of conducting material forming the top and bottom electrodes, sometimes referred to as "piston mode" operation. The piezoelectric material of a BAW, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the BAW from what is expected or from what is intended and are generally considered undesirable.

To achieve BAW filters with narrow bandwidth or extra-steep passband edges, it is sometimes useful to add capacitors in parallel with certain BAW resonators to effectively reduce the acoustic coupling coefficient. It is sometimes undesirable to implement these capacitors with surface mount devices (SMDs) or other off-die components because this could add to the device size, increase the number of input/output pins, and increase routing complexity. Instead, it is preferable to realize these capacitors as on-die structures. Aspects and embodiments of the present disclosure provide integrated resonator/capacitor structures. Aspects and embodiments disclosed herein may be used with a wide variety of BAW devices. Several illustrative examples of BAW resonators that may be integrated with a capacitor are now briefly described.

FIG. 1 is cross-sectional view of an example of a BAW, indicated generally at 100, having what may be referred to as a mesa structure. The BAW 100 is disposed on a substrate 110, for example, a silicon substrate that may include a dielectric surface layer 110A of, for example, silicon dioxide. The BAW 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru), molybdenum (Mo), or a Ru/Mo alloy. The bottom electrode 125 may include a layer 125A of Ru (or Mo or Ru/Mo alloy) disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The BAW 100 may include a central region 150 including a main active domain in the layer or film of piezoelectric material 115 in which a main acoustic wave is excited during operation. The central region 150 may also be referred to as the active area of the BAW 100. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm. In other embodiments, the top electrode 120 may have the same thickness in the central region 150, the recessed frame region(s) 155, and the raised frame region(s) 160, and the raised frame may be defined by a thicker layer of dielectric film 300 in the raised frame regions than in the central region 150 and recessed frame region(s) 155.

The recessed frame region(s) 155 and the raised frame region(s) 160 may contribute to dissipation or scattering of transverse acoustic waves generated in the BAW 100 during operation and/or may reflect transverse waves propagating outside of the recessed frame region(s) 155 and the raised frame region(s) 160 and prevent these transverse acoustic waves from entering the central region and inducing spurious signals in the main active domain region of the BAW.

Figure 2A:
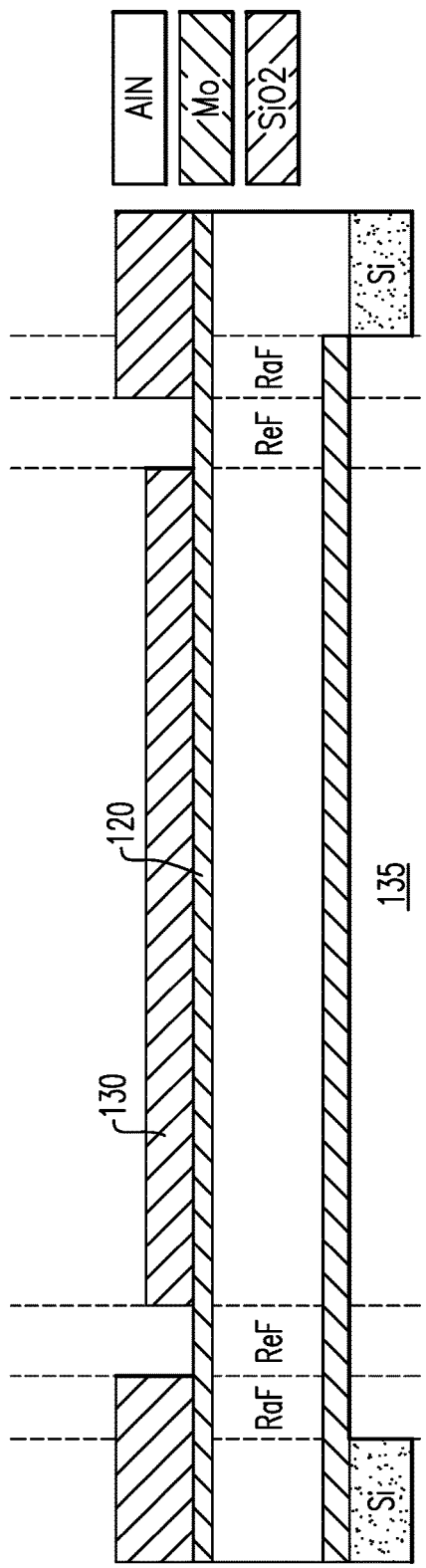
FIG. 2A illustrates a bulk acoustic wave resonator configuration in which the recessed and raised frame regions are defined by changes in thickness of dielectric material on the top of the piezoelectric film.
Figure 2B:
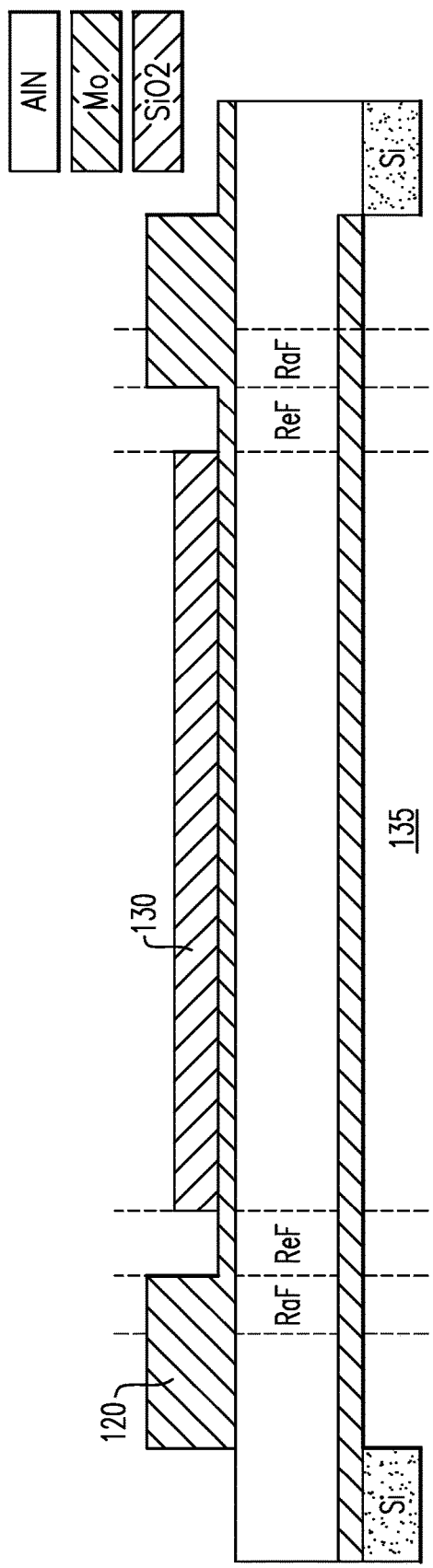
FIG. 2B illustrates a bulk acoustic wave resonator configuration in which the recessed and raised frame regions are defined by changes in thickness of the dielectric material and the electrode material on the top of the piezoelectric film.
Figure 2C:
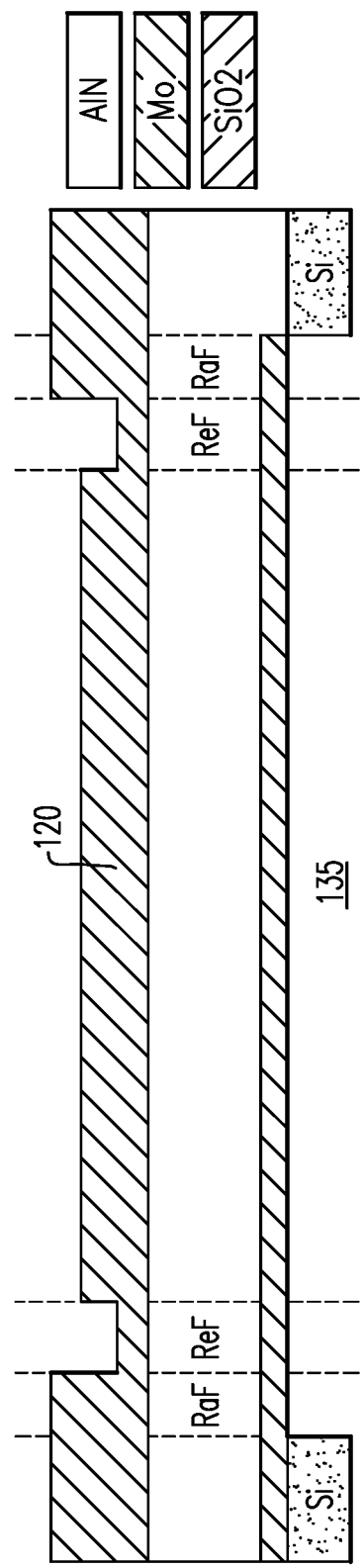
FIG. 2C illustrates a bulk acoustic wave resonator configuration in which the recessed and raised frame regions are defined by changes in thickness of the electrode material on the top of the piezoelectric film.

As discussed above with reference to FIG. 1, the raised and recessed frame regions may be formed by changes in thickness of the electrode material 120 and/or dielectric material 130 on the top of the piezoelectric film 115 of a BAW opposite the side of the piezoelectric film facing the cavity 135. FIG. 2A illustrates how the recessed and raised frame regions may be defined by changes in thickness of the dielectric material 130 (for example, SiO$_2$) on the top of the piezoelectric film 115. FIG. 2B illustrates how the recessed and raised frame regions may be defined by changes in thickness of the dielectric material 130 (for example, SiO$_2$) and the electrode material 120 on the top of the piezoelectric film 115. FIG. 2C illustrates how the recessed and raised frame regions may be defined by changes in thickness of the electrode material 120 on the top of the piezoelectric film 115. In other embodiments, the dielectric material of FIGS. 2A or 2B could be replaced by or supplemented with any other layer or material that imparts the benefit realizing a different acoustic resonance condition relative to the center of the resonator.

Figure 3A:
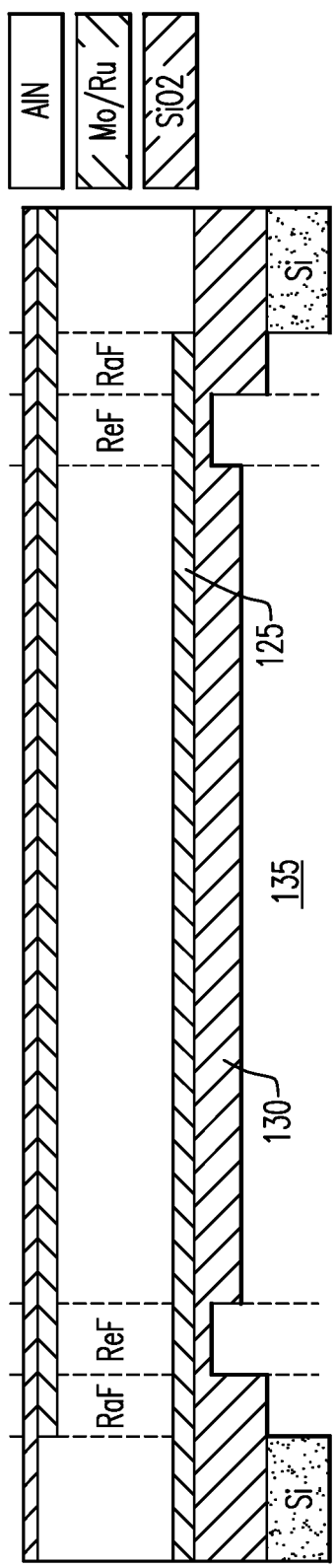
FIG. 3A illustrates a bulk acoustic wave resonator configuration in which the recessed and raised frame regions are defined by changes in thickness of dielectric material on the bottom of the piezoelectric film.
Figure 3B:
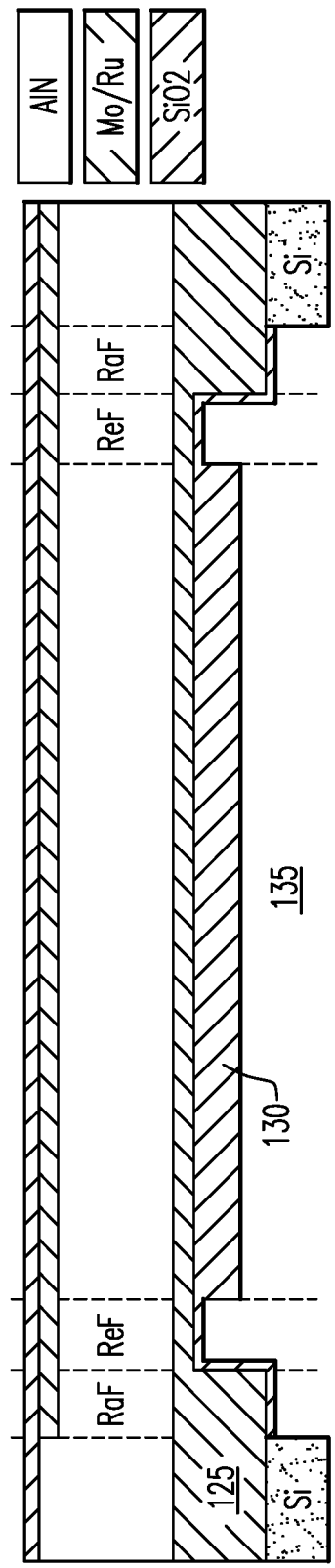
FIG. 3B illustrates a bulk acoustic wave resonator configuration in which the recessed and raised frame regions are defined by changes in thickness of the dielectric material and the electrode material on the bottom of the piezoelectric film.
Figure 3C:
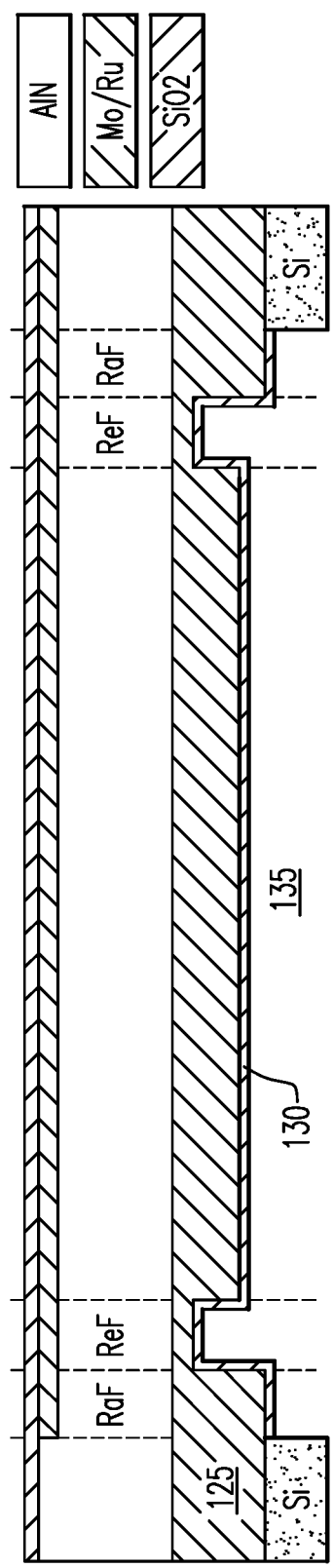
FIG. 3C illustrates a bulk acoustic wave resonator configuration in which the recessed and raised frame regions are defined by changes in thickness of the electrode material on the bottom of the piezoelectric film.

In other embodiments, the raised frame regions and recessed frame regions may be defined by changes in thickness of the electrode material 120 and/or dielectric material 130 (for example, SiO$_2$) on the bottom side of the piezoelectric film facing the cavity 135. FIG. 3A illustrates a bulk acoustic wave resonator configuration in which the recessed and raised frame regions may be defined by changes in thickness of dielectric material 130 on the bottom of the piezoelectric film. FIG. 3B illustrates a bulk acoustic wave resonator configuration in which the recessed and raised frame regions may be defined by changes in thickness of the dielectric material and the electrode material on the bottom of the piezoelectric film. FIG. 3C illustrates a bulk acoustic wave resonator configuration in which the recessed and raised frame regions may be defined by changes in thickness of the electrode material on the bottom of the piezoelectric film. In other embodiments, the dielectric material 130 of FIG. 3A or 3B could be replaced by or supplemented with any other layer or material that imparts the benefit realizing a different acoustic resonance condition relative to the center of the resonator.

Figure 4:
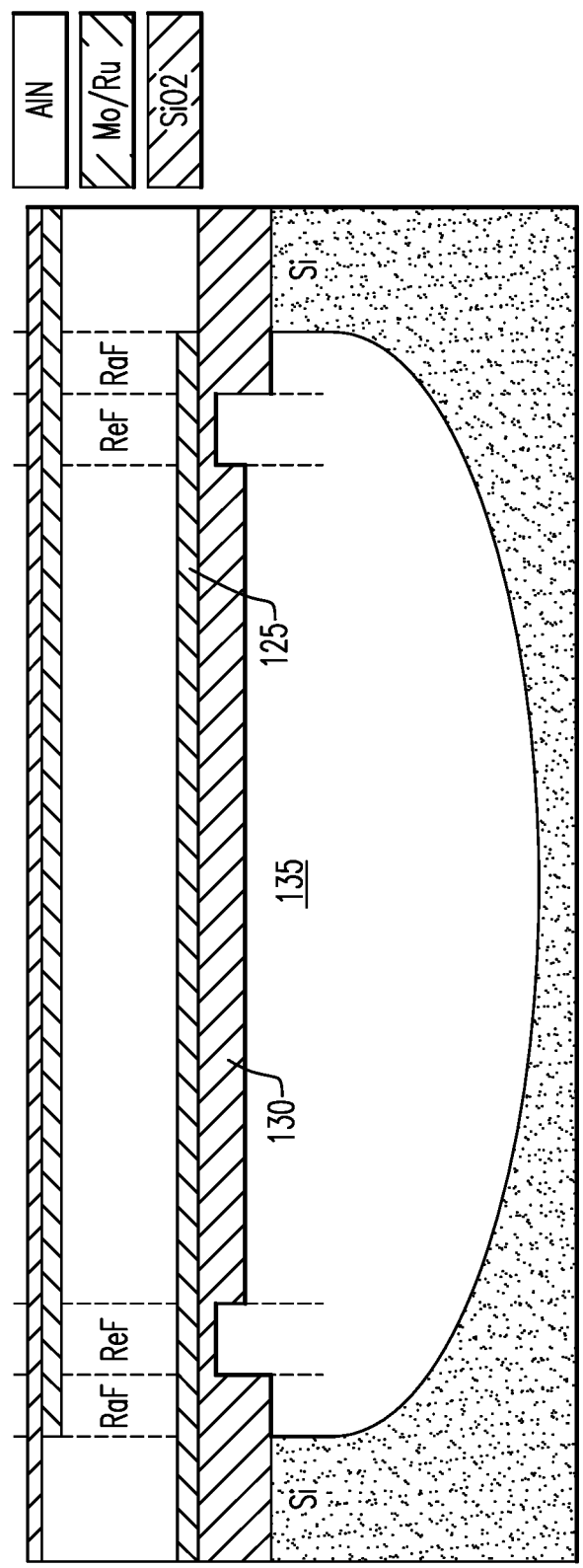
FIG. 4 illustrates an example of a bulk acoustic wave resonator with the recessed and raised frames are defined on the bottom of the piezoelectric film by changes in the thickness of the lower side dielectric layer and having an active area disposed over a cavity defined by substrate etched to form a "swimming pool" structure.

In some embodiments, instead of forming a BAW with a mesa structure as illustrated in FIG. 1 in which the piezoelectric film 115 rises up from the substrate 110 to form the flat active area 150 over the cavity 135, a BAW may be formed with a substantially planar piezoelectric material film 115 and the cavity 135 may be defined by etching a portion of the substrate 110 below the piezoelectric film 115 to form a "swimming pool" type cavity structure. FIG. 4 illustrates an example of a BAW with the recessed and raised frames defined on the bottom of the piezoelectric film by changes in the thickness of the lower side dielectric layer and having an active area disposed over a cavity 135 defined by substrate etched to form a "swimming pool" structure. The BAW of FIG. 4 may be more reliable than BAWs having a mesa structure such as the BAW illustrated in FIG. 1. The formation of the piezoelectric layer 115 with the different orientations in a mesa structure may lead to crystallographic defects in the material of the piezoelectric layer 115 that may degrade device performance. Forming a planar piezoelectric layer, as in the embodiment illustrated in FIG. 4, may help avoid such crystallographic defects. In other embodiments, the dielectric material 130 of FIG. 4 could be replaced by or supplemented with any other layer or material that imparts the benefit realizing a different acoustic resonance condition relative to the center of the resonator.

Figure 5A:
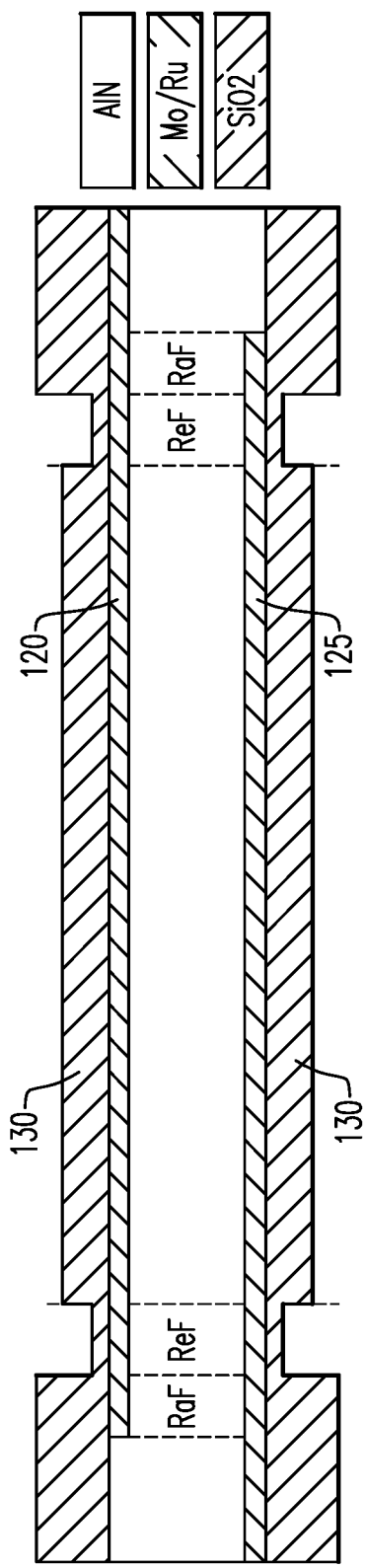
FIG. 5A illustrates a illustrates a bulk acoustic wave resonator configuration in which the recessed and raised frame regions are defined by changes in thickness of the dielectric material on the bottom and top of the piezoelectric film.
Figure 5B:
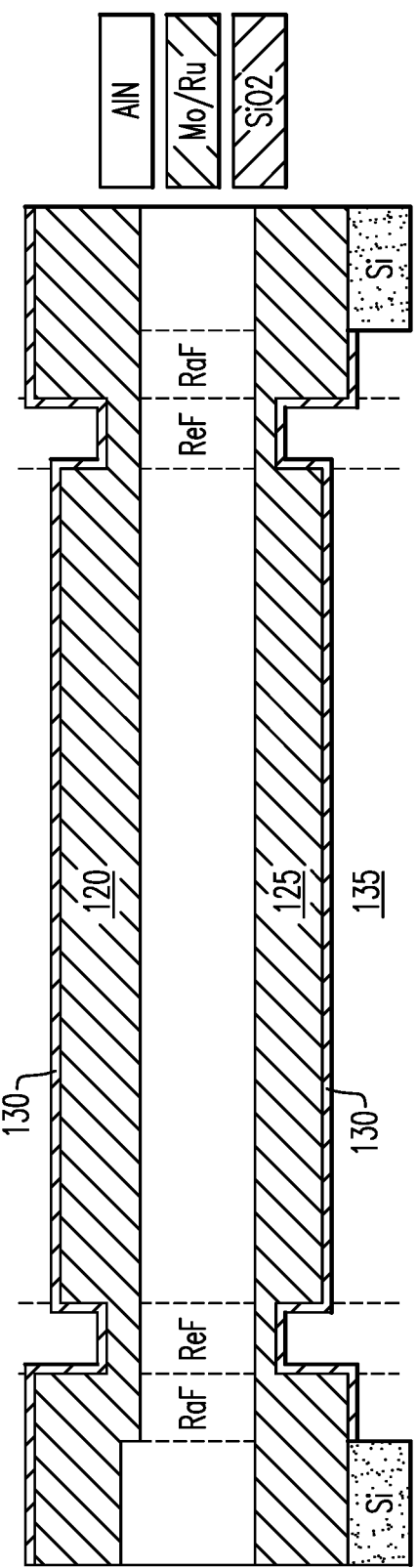
FIG. 5B illustrates a illustrates a bulk acoustic wave resonator configuration in which the recessed and raised frame regions are defined by changes in thickness of the electrode material on the bottom and top of the piezoelectric film.

In further embodiments the raised and recessed frame structures of a BAW may be formed on both the top and bottom of the piezoelectric film. FIG. 5A illustrates an example of a BAW structure in which the raised and recessed frames are defined by different thicknesses of dielectric on both the upper and lower surfaces of the piezoelectric film. In other embodiments, the dielectric material of FIG. 5A could be replaced by or supplemented with any other layer or material that imparts the benefit realizing a different acoustic resonance condition relative to the center of the resonator. FIG. 5B illustrates an example of a BAW structure in which the raised and recessed frames are defined by different thicknesses of the electrode material on both the upper and lower surfaces of the piezoelectric film.

Figure 6:
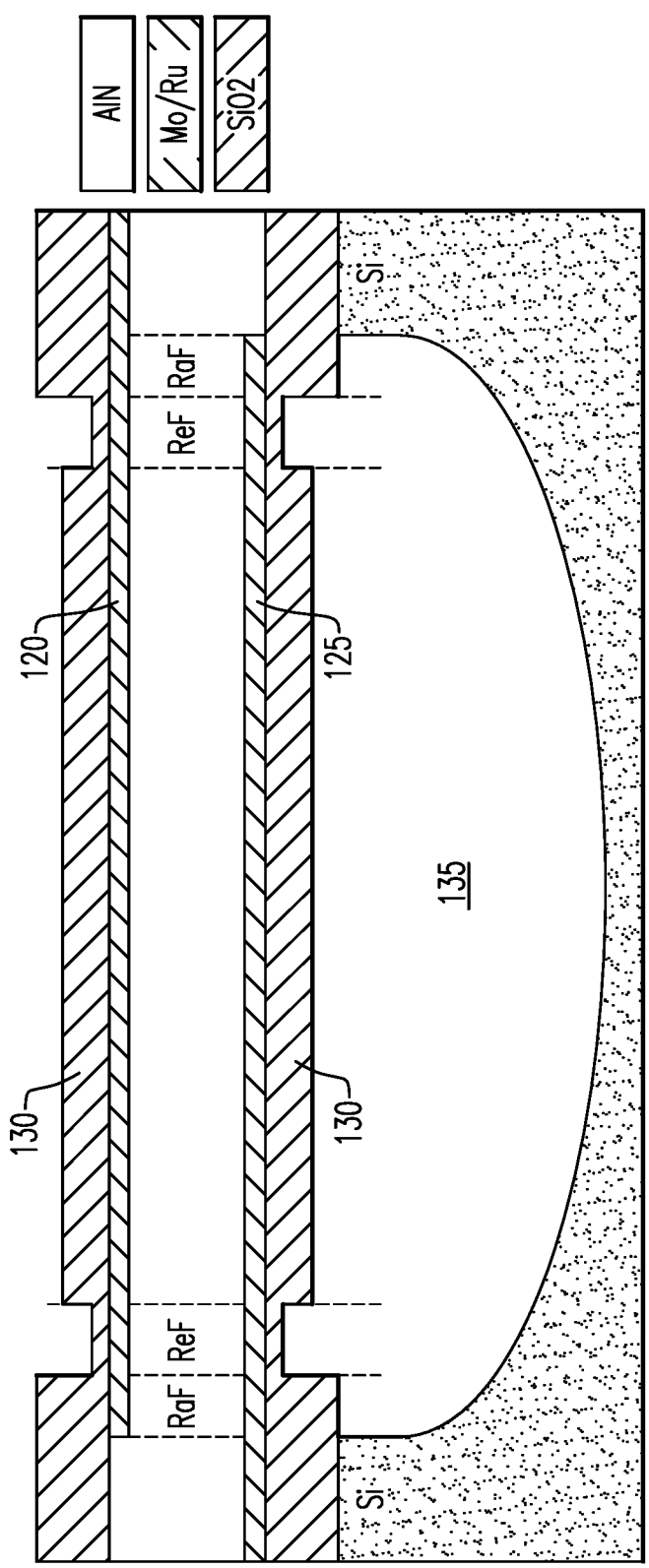
FIG. 6 illustrates the bulk acoustic wave resonator configuration of FIG. 5A disposed over a cavity in a substrate etched to form a "swimming pool" cavity structure.

A BAW in which the raised and recessed frame structures of a BAW may be formed on both the top and bottom of the piezoelectric film may also be disposed on a substrate in which the cavity 135 is formed as a swimming pool structure by etching of the substrate. FIG. 6 illustrates an example of a BAW structure including a substrate having a swimming pool type cavity 135 in which the raised and recessed frames are defined by different thicknesses of dielectric on both the upper and lower surfaces of the piezoelectric film. A BAW structure in which the raised and recessed frames are defined by different thicknesses of the electrode material on both the upper and lower surfaces of the piezoelectric film such as illustrated in FIG. 5B could also include a substrate having a swimming pool type cavity 135 as illustrated in FIG. 6.

Figure 7:
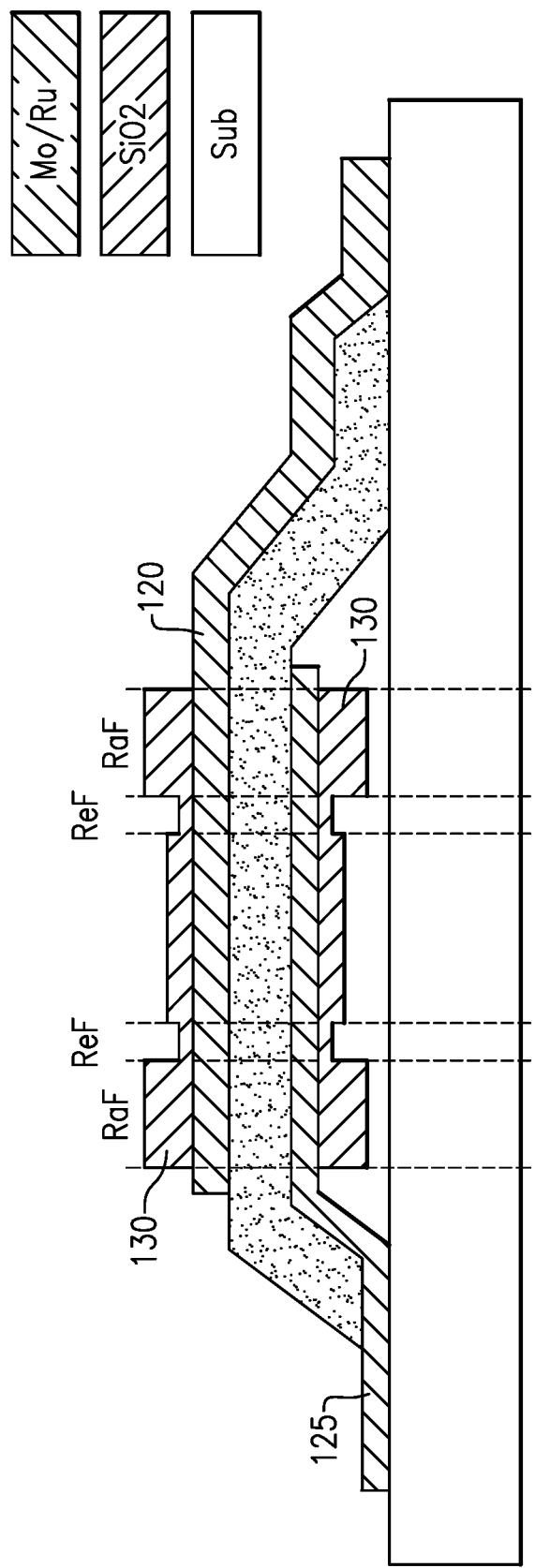
FIG. 7 illustrates a mesa type bulk acoustic wave resonator configuration in which the recessed and raised frame regions are defined by changes in thickness of the dielectric material on the bottom and top of the piezoelectric film.

Any embodiments of BAW structures disclosed herein in which the raised and recessed frames are defined by different thicknesses of the electrode material or dielectric material on both the upper and lower surfaces of the piezoelectric film may also be used to modify the mesa type BAW illustrated in FIG. 1. FIG. 7 illustrates a simplified example of a mesa type BAW having the raised and recessed frames defined by areas of dielectric material having different thicknesses on both the upper and lower sides of the piezoelectric film. The example of FIG. 7 could be modified such that the raised and recessed frames are defined by areas of electrode material having different thicknesses on both the upper and lower sides of the piezoelectric film. In other embodiments, the dielectric material 130 of FIG. 7 could be replaced by or supplemented with any other layer or material that imparts the benefit realizing a different acoustic resonance condition relative to the center of the resonator.

As discussed previously, to achieve BAW filters with narrow bandwidth or extra-steep passband edges, it is sometimes useful to add capacitors in parallel with certain BAW resonators to effectively reduce the acoustic coupling coefficient. It is sometimes undesirable to implement these capacitors with surface mount devices (SMDs) or other off-die components because this could add to the filter device size, increase the number of input/output pins, and increase routing complexity. Instead, it is preferable to realize these capacitors as on-die structures.

MIM (metal-insulator-metal) or MOM (metal-oxide-metal) capacitors can serve the purpose of on-die capacitors, but extra processing steps may be required to deposit a separate oxide or other insulating layer, especially one which is reliable, controllable, and pin-hole-free. This adds cost and complexity to the fabrication process. A more elegant solution is to use BAW resonators, themselves, as capacitors. By using extra-thick metal for the top electrode, the resonant frequency of a BAW resonator can be pushed down far below the passband of a filter including adjacent resonators so that acoustic effects are negligible at frequencies within the passband. At that frequency range the structure acts simply as a capacitor. Furthermore, since thick metal is typically already used elsewhere on the die, no extra processing steps may be required.

While this resonator-capacitor solution is effective, the structures consume significant die area above and beyond the active capacitor area. That is because, like regular BAW resonators, the resonator-capacitors utilize an "overhead" of electrode connections, routing, release holes, and keep-out regions around their periphery.

Aspects and embodiments disclosed herein overcome the issue of wasted space on the die by integrating a capacitive region around the periphery of a BAW resonator, thereby forming a parallel combination of resonator and capacitor in one monolithic structure. This may increase the resonator size by the active area of the capacitor, but the additional non-active "overhead" area is largely unchanged.

Aspects and embodiments of the integrated resonator-capacitor structure disclosed herein may be smaller and cheaper than previous solutions utilizing separate resonator and capacitor structures. It may also have the benefit of improved reliability because integrated support posts within the BAW cavity may be provided to help to counteract film stresses and reduce membrane deflection as described in further detail below.

Figure 8B:
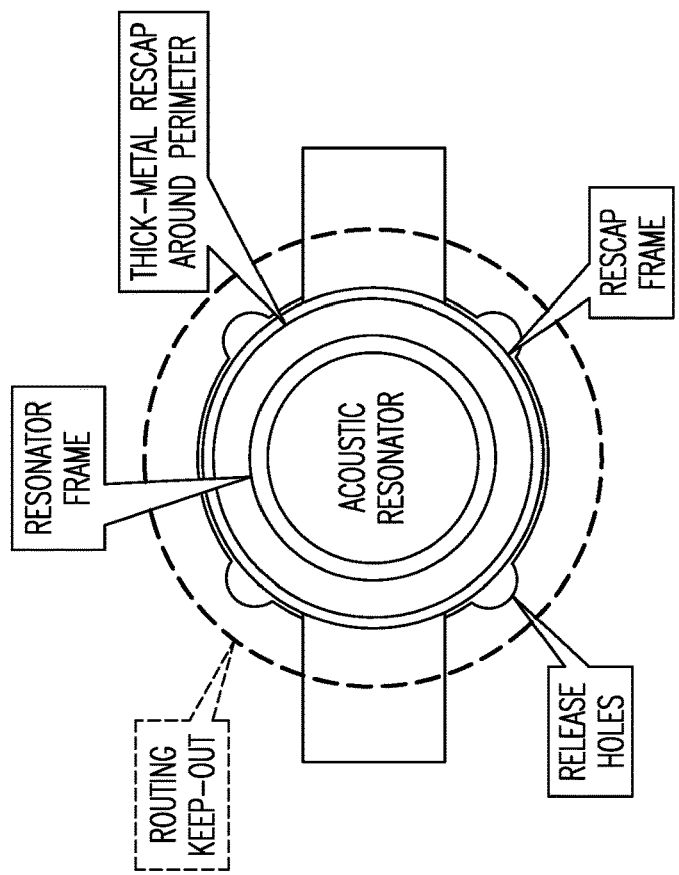
FIG. 8B is a plan view of an example of an integrated bulk acoustic resonator-capacitor.
Figure 8A:
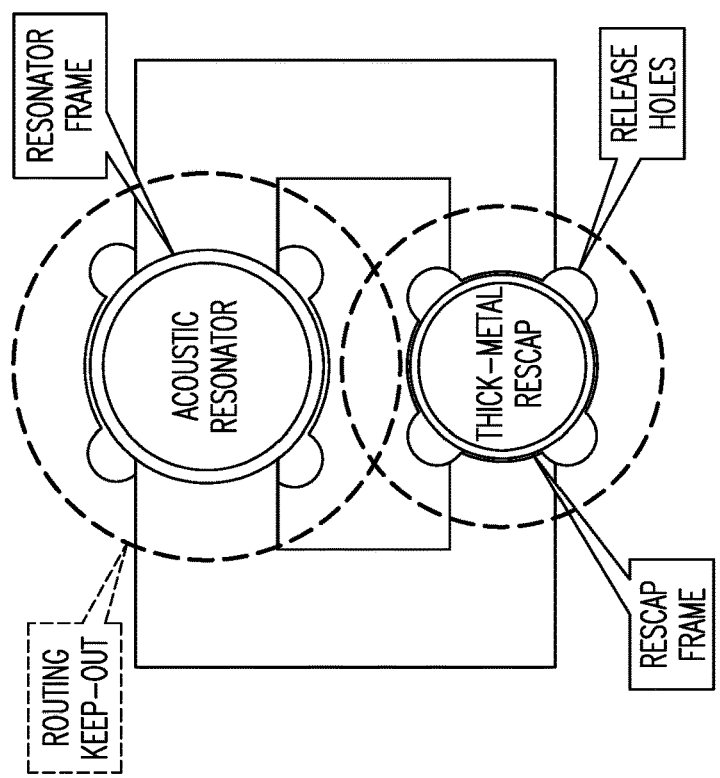
FIG. 8A is a plan view of a bulk acoustic wave resonator and a separate capacitor formed from a bulk acoustic wave resonator structure.

The concept of the integrated resonator-capacitor structure is illustrated schematically in FIGS. 8A and 8B. FIG. 8A illustrates how one may use a first BAW resonator structure in, for example, a filter or other circuit, and form a capacitor from a second resonator-capacitor (RESCAP) structure. The arrangement of FIG. 8A takes up more space than aspects of the integrated resonator-capacitor structure disclosed herein, one example of which is illustrated schematically in FIG. 8B. In the integrated resonator-capacitor structure of FIG. 8B, the capacitor function is performed by a capacitor section disposed about the periphery of the structure that performs the resonator function. In FIGS. 8A and 8B, the resonators are illustrated as circular with the capacitor forming a ring in the integrated resonator-capacitor structure, however, it should be appreciated that the aspects and embodiments disclosed herein are not limited to circular or ring-shaped resonator and capacitor structures. In some embodiments, a BAW resonator may be shaped as a regular or irregular polygon or other shape in plan view and the capacitor structure may be disposed about the perimeter of the regular or irregular polygon or other shape.

Figure 9A:
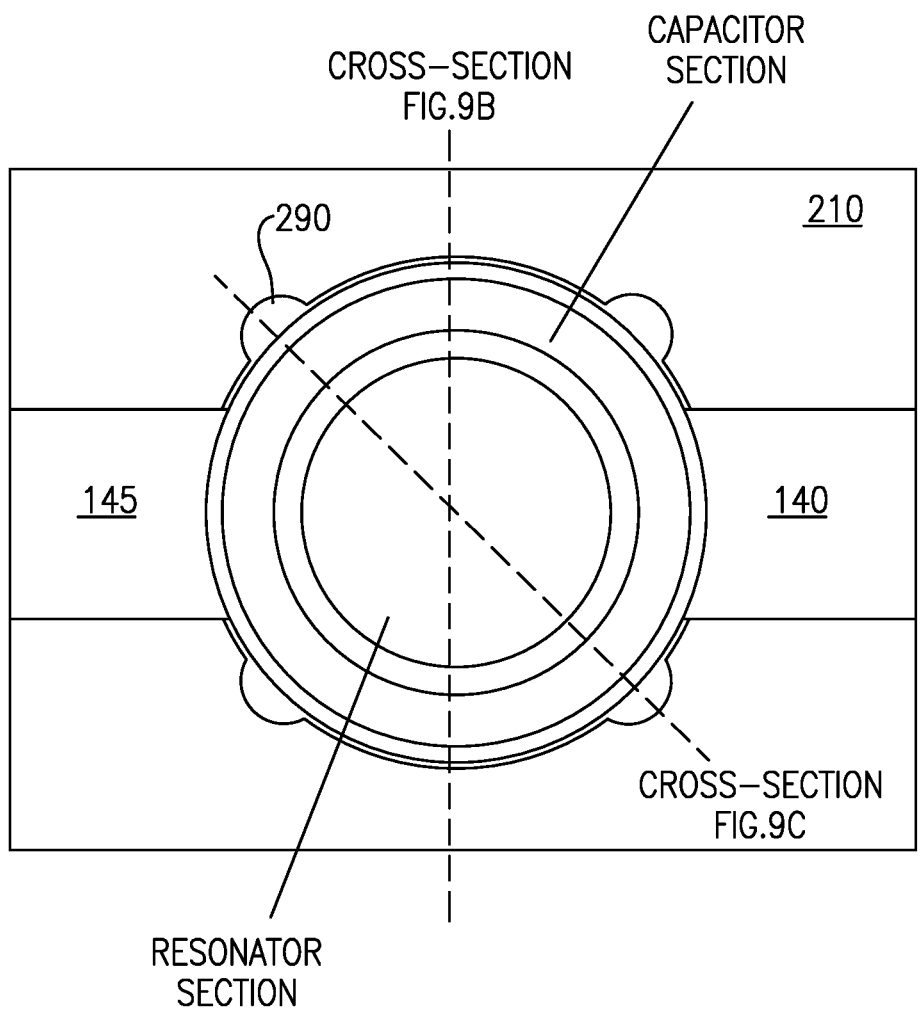
FIG. 9A is a plan view of an example of an integrated bulk acoustic resonator-capacitor.
Figure 9B:
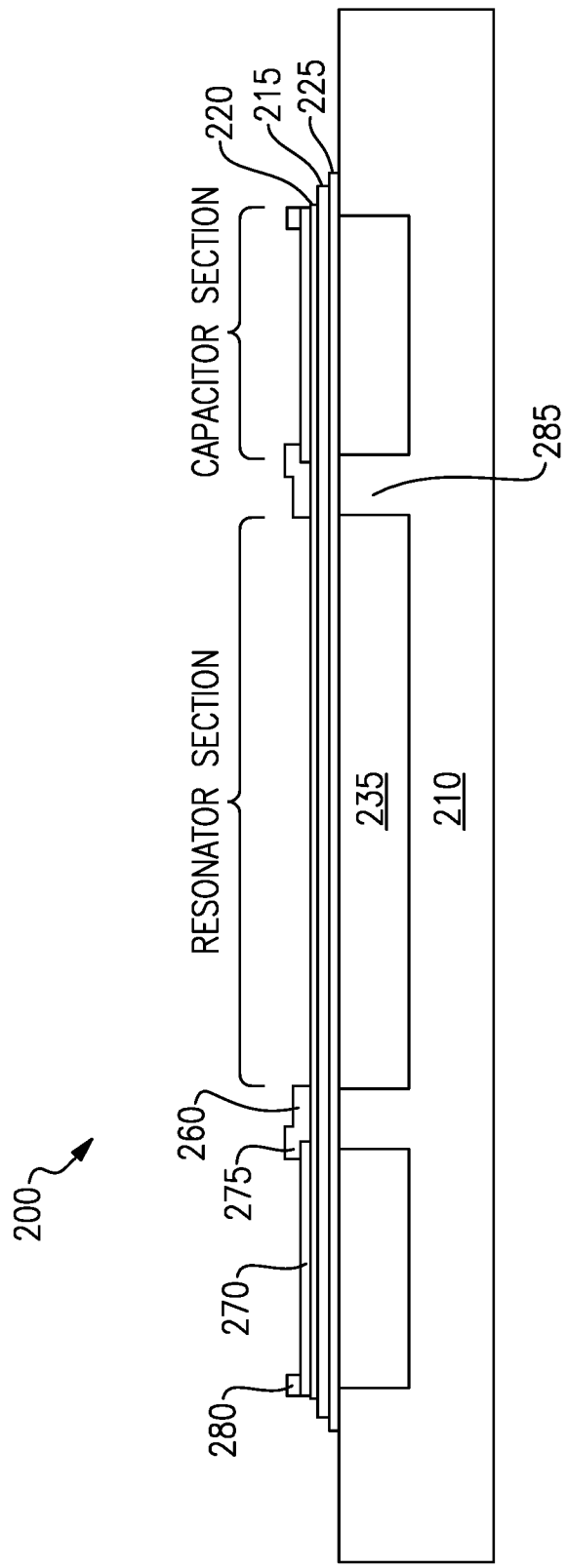
FIG. 9B is a cross-sectional view of the integrated bulk acoustic resonator-capacitor of FIG. 9A through a first cut line indicated in FIG. 9A.
Figure 9C:
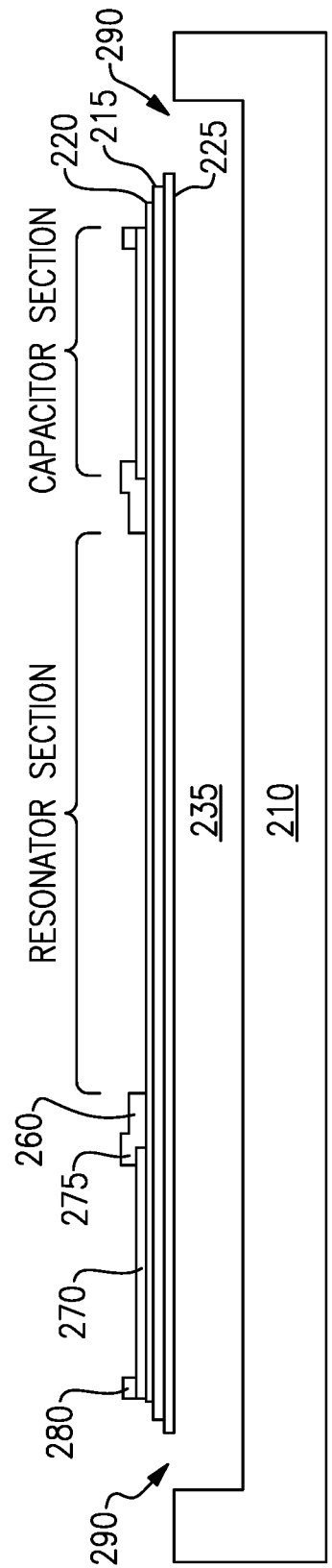
FIG. 9C is a cross-sectional view of the integrated bulk acoustic resonator-capacitor of FIG. 9A through a second cut line indicated in FIG. 9A.

An example of an integrated resonator-capacitor 200 is illustrated in cross-section in FIG. 9B along the line indicated in FIG. 9A and in FIG. 9C along the other line indicated in FIG. 9A. The integrated resonator-capacitor 200 includes a resonator section and a capacitor section circumscribing the resonator section (only one side of capacitor section indicated in FIGS. 9B and 9C for clarity). The resonator of the integrated resonator-capacitor 200 is configured as a BAW including a piezoelectric film 215 disposed between an upper electrode 220 and a lower electrode 225. The electrode/piezoelectric film stack is supported on a support substrate 210 having a "swimming pool" type structure defining a cavity 235 below the membrane including the electrode/piezoelectric film stack. The piezoelectric film 215, upper electrode 220, lower electrode 225, electrode connections 140, 145, and substrate 210 may be formed of similar materials and configuration as described above for the resonator structure of FIG. 1. Oxide or other passivation layers may be present on the upper electrode 220, lower electrode 225, and substrate 210 in a similar manner as described with respect to the resonator structure of FIG. 1, although these layers are omitted from FIGS. 9B and 9C for clarity.

A resonator raised frame 260 is disposed about the periphery of the resonator section of the integrated resonator-capacitor 200. The resonator raised frame 260 may be formed of a dielectric, for example, silicon dioxide, or may be a thickened portion of the upper electrode 220.

In other embodiments, the resonator region may include raised and/or recessed frames as described with respect to any of FIGS. 2A-7 above.

The capacitor section of the integrated resonator-capacitor 200 includes a layer of conductive material 270 disposed about a periphery of the upper electrode 220. The layer of conductive material 270 may be electrically coupled to the upper electrode 220. The upper electrode connection 145 may thus electrically couple to both the upper electrode 220 and the layer of conductive material 270 of the capacitor section. The layer of conductive material 270 may be a thickened portion of the upper electrode 220 and may be formed of the same material as the upper electrode 220. The layer of conductive material 270 may have a width of between about 5% and 50% of the radius (or between 2.5% and 25% of the width of the least widthwise dimension) of the membrane including the piezoelectric film and electrode stack. The capacitor section further includes a capacitor inner raised frame 275 on top on the inner periphery of the layer of conductive material 270 adjacent to or abutting the resonator raised frame 260, and a capacitor outer raised frame 280 on top of the outer periphery of the conductive material 270. The capacitor inner raised frame 275 and capacitor outer raised frame 280 may be formed of a dielectric, for example, silicon dioxide, or may be a thickened portion of the layer of conductive material 270. In some embodiments, in which the resonator raised frame 260 is formed of a conductive material, for example, a metal or alloy, the layer of conductive material 270 and/or capacitor inner raised frame 275 and/or capacitor outer raised frame 280 may be formed of the same material as the resonator raised frame 260 and may be formed contiguous with the resonator raised frame 260.

The resonator raised frame 260 may perform the same function as the raised frame 160 of the BAW of FIG. 1—to dissipate or scatter transverse acoustic waves generated in the BAW 200 during operation and/or may reflect transverse waves propagating outside of the raised frame 260 and prevent these transverse acoustic waves from entering the central region and inducing spurious signals in the main active domain region of the BAW. The layer of conductive material 270 may decrease the resonant frequency of the resonator structure in the capacitor region to a frequency outside of a passband of a circuit, for example, a filter that the resonator structure is used in. The capacitor inner raised frame 275 and capacitor outer raised frame 280 may dissipate or scatter transverse acoustic waves generated in the capacitor region during operation and prevent these transverse waves from propagating into and interfering with operation of the resonator portion of the integrated resonator-capacitor 200.

The integrated resonator-capacitor 200 may further include one or more interior support posts 285 extending upward from the upper surface of the substrate 210 defining the lower extent of the cavity 235 to the lower electrode 225, optionally separated from the lower electrode 225 by a layer of silicon dioxide or other insulating material (not illustrated). The one or more interior support posts 285 may contact the lower electrode 225 at a boundary between the resonator region and the capacitor region, for example, below the resonator raised frame 260. The interior support posts 285 between the resonator and capacitor regions may help to reduce strain (bow/warpage) of the electrodes/piezoelectric material membrane, provide a low-resistance path for heat to escape the resonator region, and may provide acoustic dampening to reduce acoustic coupling between the resonator region and capacitor region.

Figure 9D:
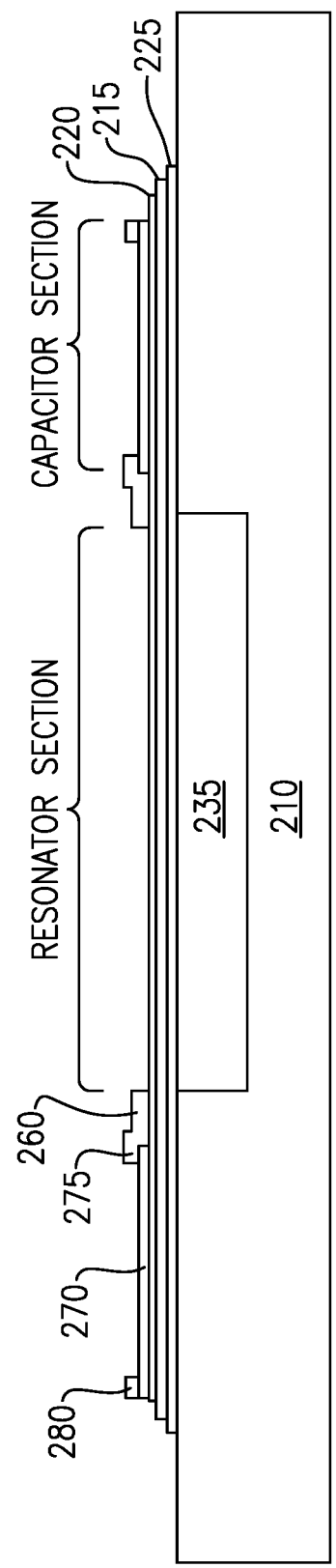
FIG. 9D is a cross-sectional view of another example of an integrated bulk acoustic resonator-capacitor.

In other embodiments, the cavity 235 beneath the capacitor region is omitted. This cavity is not needed in some instances because the capacitor region is not required to vibrate. The interior support posts 285 may thus be merged with the portion of the substrate 210 below the capacitor region. See FIG. 9D.

The integrated resonator-capacitor 200 may further include one or more release holes 290 defined in the substrate 210 outside of a periphery of the electrodes/piezoelectric material membrane. The release holes 290 are utilized during manufacture of the integrated resonator-capacitor 200 to introduce and remove an etchant or solvent to remove sacrificial material from the cavity area to define the cavity 235 to form the "swimming pool" structure. Release ports having a similar configuration may also be present in an integrated resonator-capacitor having a mesa structure.

Figure 10A:
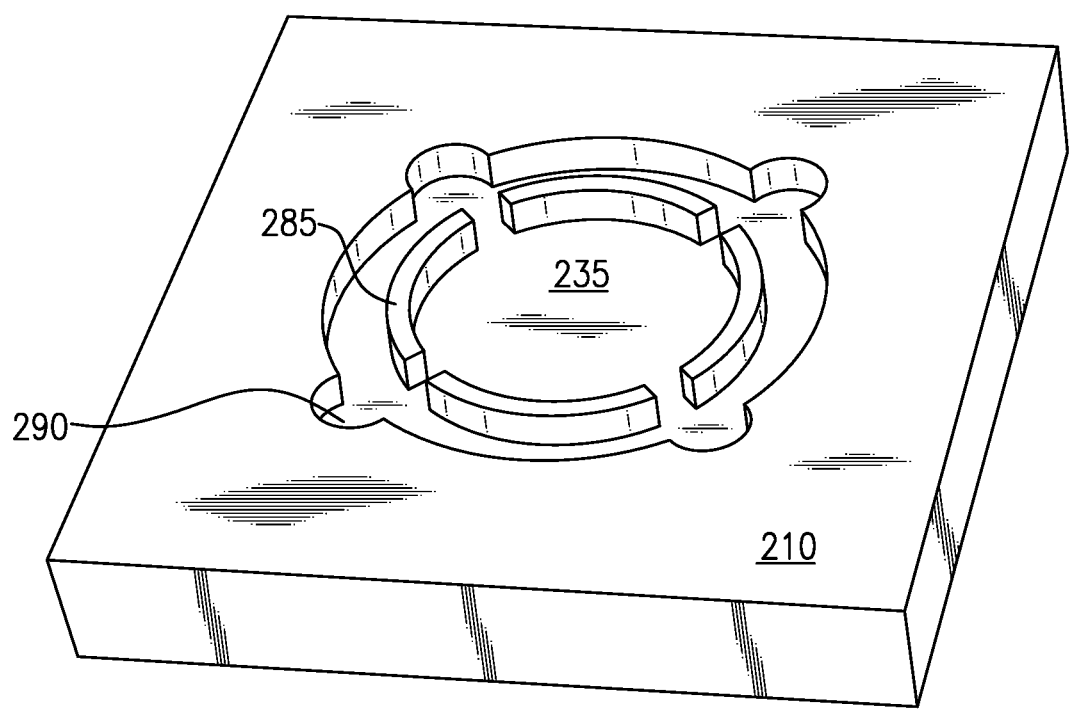
FIG. 10A is an isometric view of an example of a support substrate for an integrated bulk acoustic resonator-capacitor.
Figure 10B:
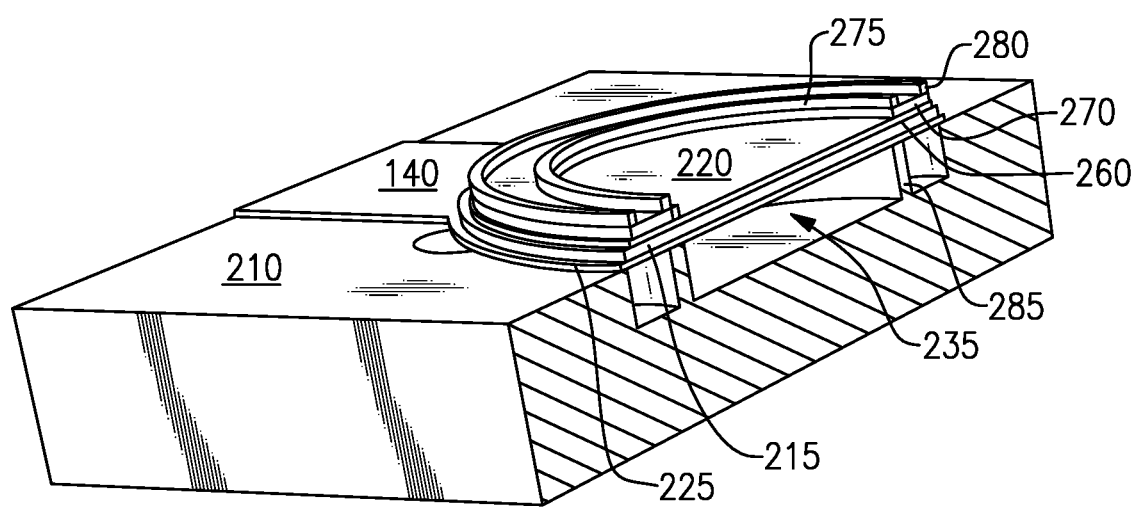
FIG. 10B is an isometric cross-sectional view of an example of an integrated bulk acoustic resonator-capacitor.
Figure 10C:
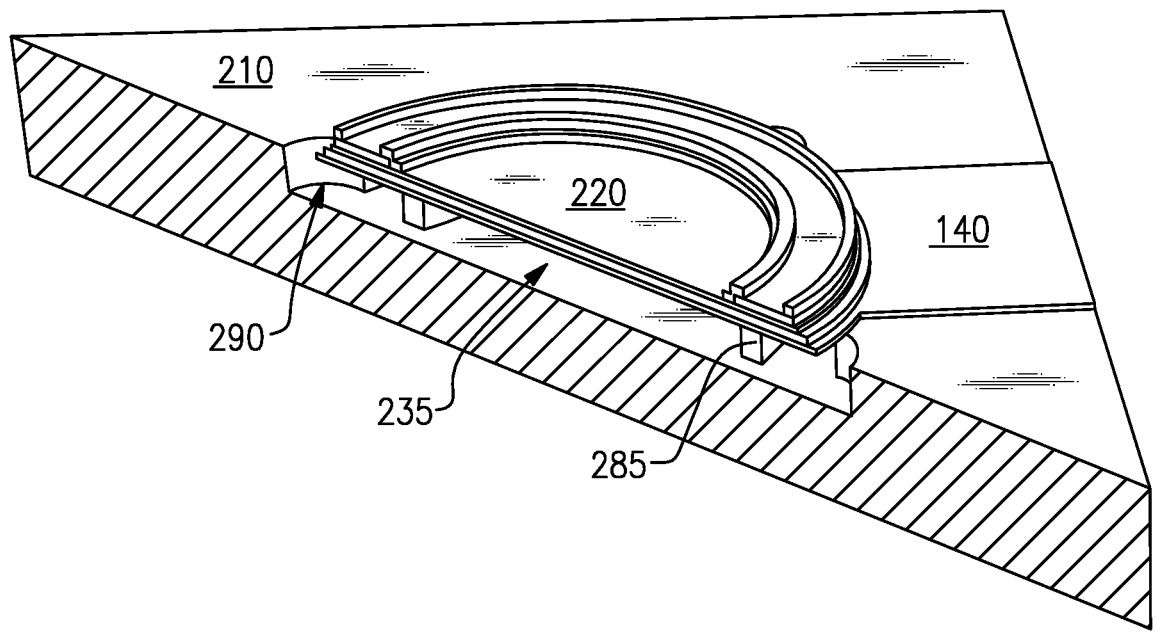
FIG. 10C is another isometric cross-sectional view of an example of an integrated bulk acoustic resonator-capacitor.

FIG. 10A illustrates the shape of the recess formed in the substrate to define the cavity 235, the interior support posts 285, and the release holes 290. As shown, the interior support posts 285 may be in the form of walls of material rather than posts, however, in other embodiments, may be in the form of posts. FIGS. 10B and 10C are isometric cross-sectional diagrams illustrating additional features of an example of an integrated resonator-capacitor as disclosed herein.

It should be appreciated that although described as being formed with a "swimming pool" type substrate, examples of the integrated resonator-capacitor 200 may also be formed with a mesa configuration as illustrated for the BAW of FIG. 1 or FIG. 7, amended to include the capacitor region as described above.

It should be appreciated that the BAWs and integrated resonator/capacitor structures illustrated in the figures presented herein are illustrated in a highly simplified form. The relative dimensions of the different features are not shown to scale. Further, aspects and embodiments of the disclosed BAWs and integrated resonator/capacitor structures may include additional features or layers not illustrated.

Figure 11:
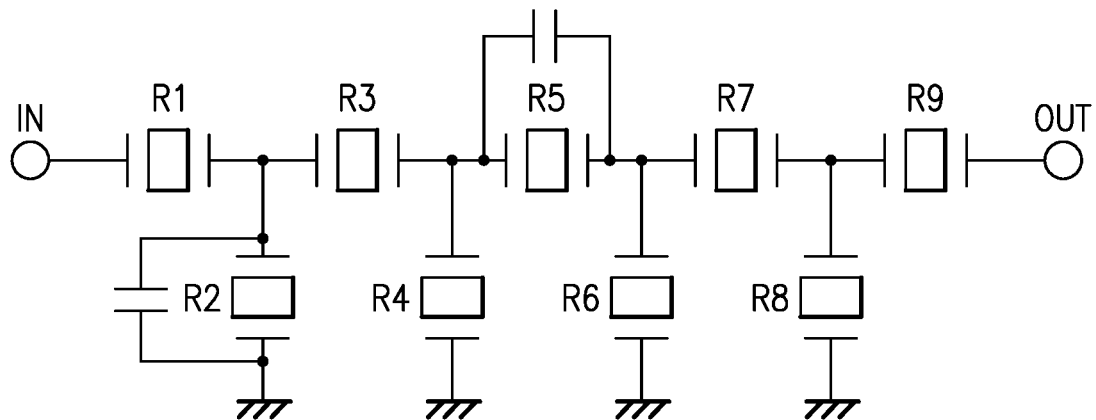
FIG. 11 is a schematic diagram of a radio frequency ladder filter.

In some embodiments, multiple BAWs and/or integrated resonator/capacitor structures as disclosed herein may be combined into a filter, for example, an RF ladder filter schematically illustrated in FIG. 11 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. One or more of the series or shunt resonators may include an integrated capacitor as disclosed herein, illustrated as a capacitive element in parallel with resonators R2 and R5, as an example. In some implementations, it may be more advantageous to provide the integrated capacitors in the series resonators of the ladder filter. The integrated capacitors would reduce the kt2_effective of the series resonators causing the rolloff to be faster on the high frequency side of the passband. Other filter structures and other circuit structures known in the art that may include BAW devices or resonators, for example, duplexers, baluns, etc., may also be formed including examples of BAW resonators as disclosed herein.

Figure 12:
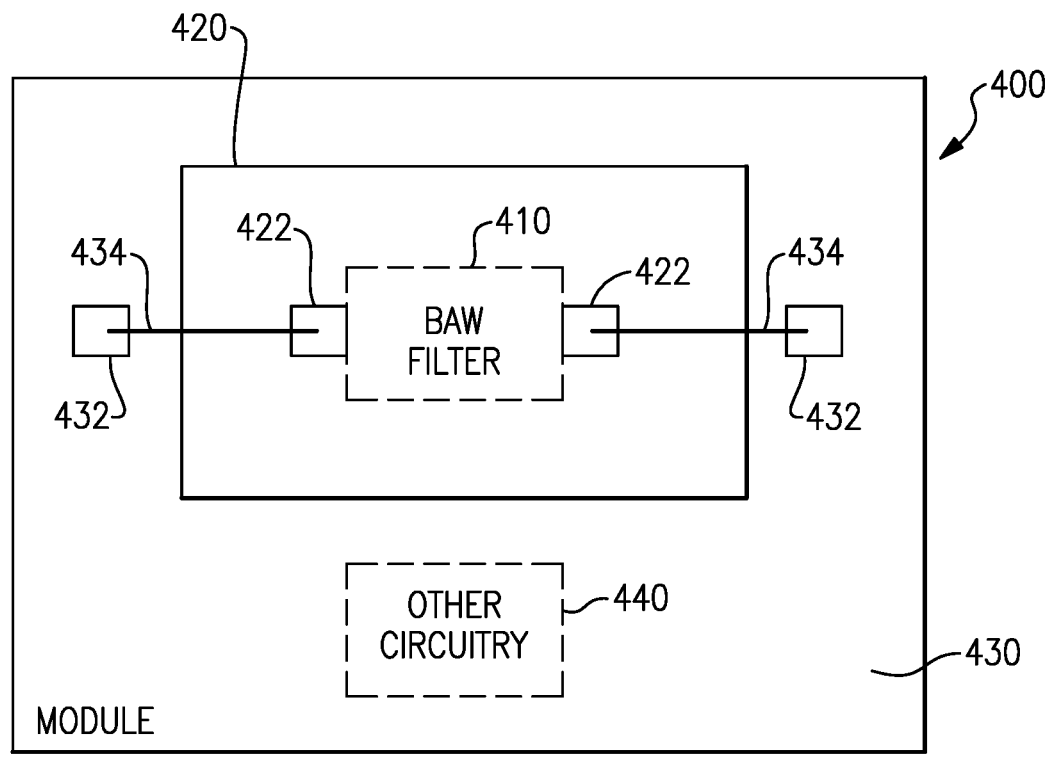
FIG. 12 is a block diagram of one example of a filter module that can include one or more acoustic wave elements according to aspects of the present disclosure.
Figure 13:
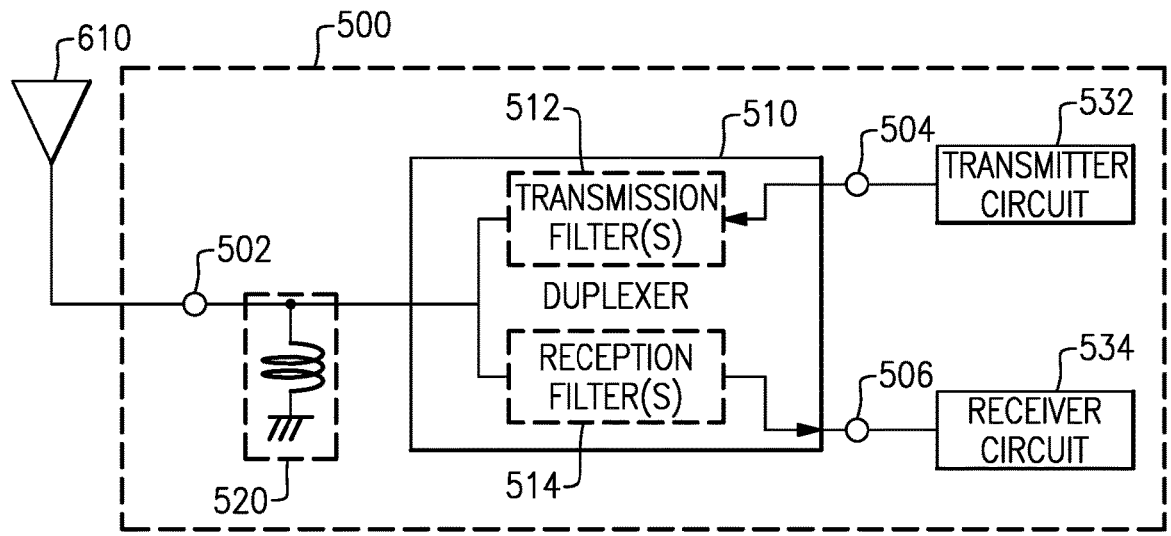
FIG. 13 is a block diagram of one example of a front-end module that can include one or more filter modules according to aspects of the present disclosure.
Figure 14:
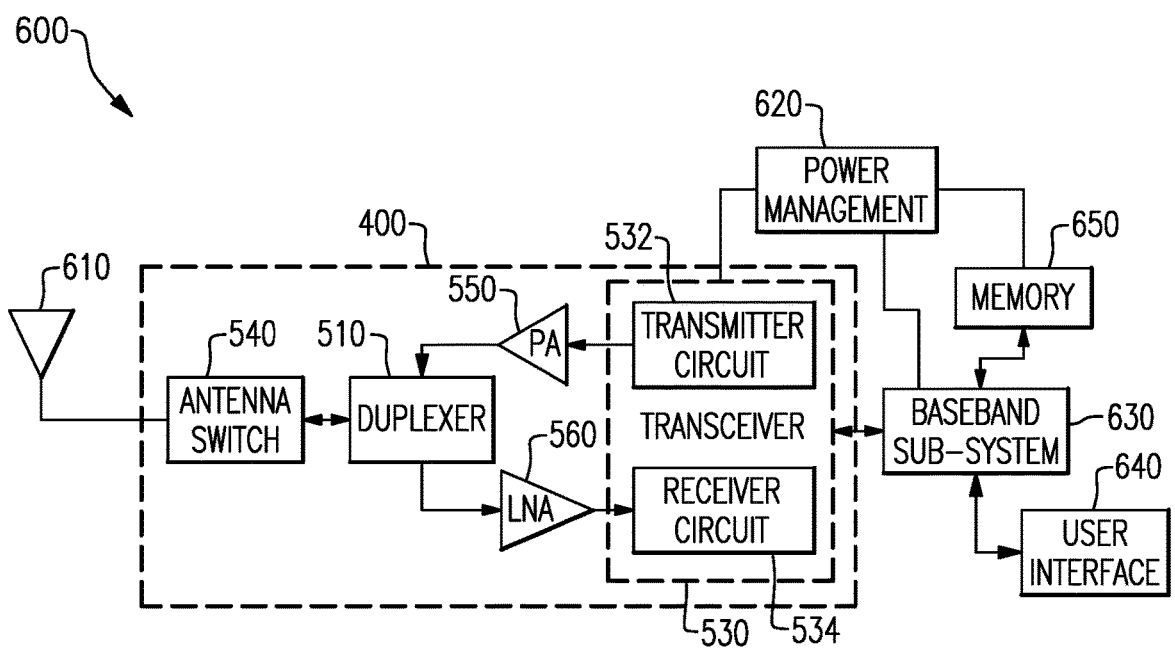
FIG. 14 is a block diagram of one example of a wireless device including the front-end module of FIG. 13.

The acoustic wave devices discussed herein can be implemented in a variety of packaged modules. Some example packaged modules will now be discussed in which any suitable principles and advantages of the packaged acoustic wave devices discussed herein can be implemented. FIGS. 12, 13, and 14 are schematic block diagrams of illustrative packaged modules and devices according to certain embodiments.

As discussed above, embodiments of the disclosed BAWs and/or integrated resonator/capacitor structures can be configured as or used in filters, for example. In turn, a BAW filter using one or more BAW elements may be incorporated into and packaged as a module that may ultimately be used in an electronic device, such as a wireless communications device, for example. FIG. 12 is a block diagram illustrating one example of a module 400 including a BAW filter 410 wherein one or more of the BAWs may include an integrated capacitor as disclosed herein. The BAW filter 410 may be implemented on one or more die(s) 420 including one or more connection pads 422. For example, the BAW filter 410 may include a connection pad 422 that corresponds to an input contact for the BAW filter and another connection pad 422 that corresponds to an output contact for the BAW filter. The packaged module 400 includes a packaging substrate 430 that is configured to receive a plurality of components, including the die 420. A plurality of connection pads 432 can be disposed on the packaging substrate 430, and the various connection pads 422 of the BAW filter die 420 can be connected to the connection pads 432 on the packaging substrate 430 via electrical connectors 434, which can be solder bumps or wirebonds, for example, to allow for passing of various signals to and from the BAW filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the BAW filter 410 can be used in a wide variety of electronic devices. For example, the BAW filter 410 can be used in an antenna duplexer, which itself can be incorporated into a variety of electronic devices, such as RF front-end modules and communication devices.

Referring to FIG. 13, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the BAW filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 13, however in other embodiments these components may be integrated into a common transceiver circuit or module. As will be appreciated by those skilled in the art, the front-end module 500 may include other components that are not illustrated in FIG. 13 including, but not limited to, switches, electromagnetic couplers, amplifiers, processors, and the like.

FIG. 14 is a block diagram of one example of a wireless device 600 including the antenna duplexer 510 shown in FIG. 13. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 13. The front-end module 500 includes the duplexer 510, as discussed above. In the example shown in FIG. 14 the front-end module 500 further includes an antenna switch 540, which can be configured to switch between different frequency bands or modes, such as transmit and receive modes, for example. In the example illustrated in FIG. 14, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 13.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 14, the front-end module 500 may further include a low noise amplifier module 560, which amplifies received signals from the antenna 610 and provides the amplified signals to the receiver circuit 534 of the transceiver 530.

The wireless device 600 of FIG. 14 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An integrated bulk acoustic wave resonator-capacitor comprising:
    a membrane including a piezoelectric film, an upper electrode disposed on a top surface of the piezoelectric film, and a lower electrode disposed on a lower surface of the piezoelectric film;
    a resonator region of the membrane defining a main active domain in which a main acoustic wave is generated during operation;
    a capacitor region of the membrane surrounding the resonator region, the capacitor region including a layer of conductive material disposed on the upper electrode, an inner capacitor raised frame defined on an inner peripheral region of the layer of conductive material, and an outer capacitor raised frame defined on an outer peripheral region of the layer of conductive material;
    a support substrate upon which a periphery of the membrane is disposed and that defines a cavity beneath the resonator region; and
    a support in a form of one or more posts extending upward from a surface of the support substrate defining a lower wall of the cavity to a lower surface of the membrane, the support contacting the lower surface of the membrane at a border between the capacitor region and the resonator region.

2. The integrated bulk acoustic wave resonator-capacitor of claim 1 further comprising a resonator raised frame disposed on the upper electrode about a perimeter of the resonator region.

3. The integrated bulk acoustic wave resonator-capacitor of claim 2 wherein the resonator raised frame abuts the inner capacitor raised frame.

4. The integrated bulk acoustic wave resonator-capacitor of claim 2 wherein the resonator raised frame is formed of a different material than the inner capacitor raised frame.

5. The integrated bulk acoustic wave resonator-capacitor of claim 4 wherein one of the resonator raised frame or the inner capacitor raised frame is formed of a dielectric material and an other of the resonator raised frame or the inner capacitor raised frame is formed of a metal.

6. The integrated bulk acoustic wave resonator-capacitor of claim 2 wherein the resonator raised frame is formed of a same material as the inner capacitor raised frame.

7. The integrated bulk acoustic wave resonator-capacitor of claim 6 wherein the layer of conductive material is formed of the same material.

8. The integrated bulk acoustic wave resonator-capacitor of claim 7 wherein the upper electrode is formed of the same material.

9. The integrated bulk acoustic wave resonator-capacitor of claim 8 wherein the outer capacitor raised frame is formed of the same material.

10. The integrated bulk acoustic wave resonator-capacitor of claim 6 wherein the same material is a dielectric material.

11. The integrated bulk acoustic wave resonator-capacitor of claim 10 wherein the outer capacitor raised frame is formed of the same material.

12. The integrated bulk acoustic wave resonator-capacitor of claim 1 wherein the support substrate further defines a cavity beneath the capacitor region.

13. The integrated bulk acoustic wave resonator-capacitor of claim 1 wherein no cavity is defined in the support substrate below the capacitor region.

14. The integrated bulk acoustic wave resonator-capacitor of claim 1 wherein the layer of conductive material is formed of a same material as the upper electrode.

15. The integrated bulk acoustic wave resonator-capacitor of claim 1 having a mesa structure.

16. The integrated bulk acoustic wave resonator-capacitor of claim 1 included in a radio frequency filter.

17. The integrated bulk acoustic wave resonator-capacitor of claim 16 included in an electronic device module.

18. The integrated bulk acoustic wave resonator-capacitor of claim 17 included in an electronic device.

* * * * *